United States Patent
Lajevardi et al.

(10) Patent No.: US 10,761,517 B2
(45) Date of Patent: Sep. 1, 2020

(54) EXTRACTING REAL-TIME DATA FROM ETHERCAT SENSOR BUS IN A SUBSTRATE PROCESSING SYSTEM

(71) Applicant: LAM RESEARCH CORPORATION, Fremont, CA (US)

(72) Inventors: Behzad Lajevardi, Fremont, CA (US); Willie Ku, Fremont, CA (US); Tom Trinh, Dublin, CA (US); Henry Chan, San Jose, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 28 days.

(21) Appl. No.: 16/110,348

(22) Filed: Aug. 23, 2018

(65) Prior Publication Data

US 2020/0064818 A1    Feb. 27, 2020

(51) Int. Cl.
| | |
|---|---|
| G05B 19/418 | (2006.01) |
| H04L 12/24 | (2006.01) |
| G06F 3/0484 | (2013.01) |
| G01R 13/02 | (2006.01) |
| G06F 3/14 | (2006.01) |

(52) U.S. Cl.
CPC ....... G05B 19/4186 (2013.01); G01R 13/029 (2013.01); G06F 3/0484 (2013.01); G06F 3/14 (2013.01); H04L 41/0803 (2013.01); G05B 2219/25006 (2013.01); G05B 2219/25174 (2013.01)

(58) Field of Classification Search
CPC .................................................. G05B 19/4186
See application file for complete search history.

(56) References Cited

U.S. PATENT DOCUMENTS

| | | | | |
|---|---|---|---|---|
| 8,821,099 | B2* | 9/2014 | Hall | H01L 21/67775 |
| | | | | 118/500 |
| 10,389,659 | B2* | 8/2019 | Janhar | H04L 69/04 |
| 2010/0226444 | A1* | 9/2010 | Thevathasan | H04N 21/2187 |
| | | | | 375/240.29 |
| 2015/0301100 | A1* | 10/2015 | Valcore, Jr. | H01J 37/32174 |
| | | | | 702/59 |

* cited by examiner

*Primary Examiner* — Tammara R Peyton

(57) ABSTRACT

A network interface controller for a communication network of a substrate processing system includes a data collection module configured to monitor a communication bus to retrieve and store data frames transmitted between components of the substrate processing system. A user interface is configured to receive inputs for configuring extraction of data from the data frames. A data processing module is configured to store, based on a network configuration file, a map correlating data within the data frames to of the components of the substrate processing system, extract data from the data frames in accordance with the inputs received by the user interface and the map, and provide, to the user interface, the data as extracted from the data frames. The user interface is further configured to display the data as extracted from the data frames in accordance with the inputs received by the user interface.

18 Claims, 7 Drawing Sheets

FIG. 5C

EXTRACTING REAL-TIME DATA FROM ETHERCAT SENSOR BUS IN A SUBSTRATE PROCESSING SYSTEM

FIELD

The present disclosure relates to monitoring and storing data in a substrate processing system.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to perform etching, deposition, and/or other treatment of substrates such as semiconductor wafers. Example processes that may be performed on a substrate include, but are not limited to, a chemical vapor deposition (CVD) process, a plasma enhanced chemical vapor deposition (PECVD) process, a chemically enhanced plasma vapor deposition (CEPVD) process, an ion implantation process, an atomic layer deposition (ALD) process, and/or other deposition, etch, and cleaning processes. A substrate may be arranged on a substrate support such as a pedestal, an electrostatic chuck (ESC), etc. in a processing chamber of the substrate processing system. The substrate processing system may include one or more components for monitoring data associated with operation of the substrate processing system.

SUMMARY

A network interface controller for a communication network of a substrate processing system includes a data collection module coupled to a communication bus of the substrate processing system. The data collection module is configured to monitor the communication bus to retrieve and store data frames transmitted between components of the substrate processing system on the communication bus. A user interface is configured to receive inputs for configuring extraction of data from the data frames. A data processing module is configured to store, based on a network configuration file, a map correlating data within the data frames to respective ones of the components of the substrate processing system. The network configuration file stores configuration information for the communication network. The data processing module is further configured to extract data from the data frames in accordance with the inputs received by the user interface and the map, and provide, to the user interface, the data as extracted from the data frames. The user interface is further configured to display the data as extracted from the data frames in accordance with the inputs received by the user interface.

In other features, the communication network is an EtherCAT network. The network configuration file is an EtherCAT network information (ENI) file. The network configuration file stores the configuration information in an XML format. The map correlates relative locations of the data within the data frames with at least one of respective types of data in the relative locations and respective ones of the components of the substrate processing system. The relative locations of the data within the data frame correspond to bit locations within the data frame.

In other features, the map correlates sub-frames of the data frames with respective ones of the components of the substrate processing system. The data extracted from the data frames includes sensor data. The user interface includes a display configured to display the data extracted from the data frames. The user interface is configured to display the data extracted from the data frames as an oscilloscope signal.

A method of operating a communication network of a substrate processing system includes using a data collection module coupled to a communication bus of the substrate processing system to monitor the communication bus to retrieve and store data frames transmitted between components of the substrate processing system on the communication bus and receive, via a user interface, inputs for configuring extraction of data from the data frames. The method further includes, using a data processing module to store, based on a network configuration file, a map correlating data within the data frames to respective ones of the components of the substrate processing system, extract data from the data frames in accordance with the inputs received by the user interface and the map, and provide, to the user interface, the data as extracted from the data frames. The network configuration file stores configuration information for the communication network. The data as extracted from the data frames is displayed in accordance with the inputs received by the user interface.

In other features, the communication network is an EtherCAT network. The network configuration file is an EtherCAT network information (ENI) file. The method further includes storing the configuration information in the network configuration file in an XML format. The map correlates relative locations of the data within the data frames with at least one of respective types of data in the relative locations and respective ones of the components of the substrate processing system. The relative locations of the data within the data frame correspond to bit locations within the data frame.

In other features, the map correlates sub-frames of the data frames with respective ones of the components of the substrate processing system. The data extracted from the data frames includes sensor data. The method further includes using a display to display the data extracted from the data frames. The method further includes displaying the data extracted from the data frames as an oscilloscope signal.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIGS. 5A, 5B, and 5C illustrate an example user interface in accordance with the present disclosure.

In the drawings, reference numbers may be reused to identify similar and/or identical elements.

DETAILED DESCRIPTION

Figure 1:
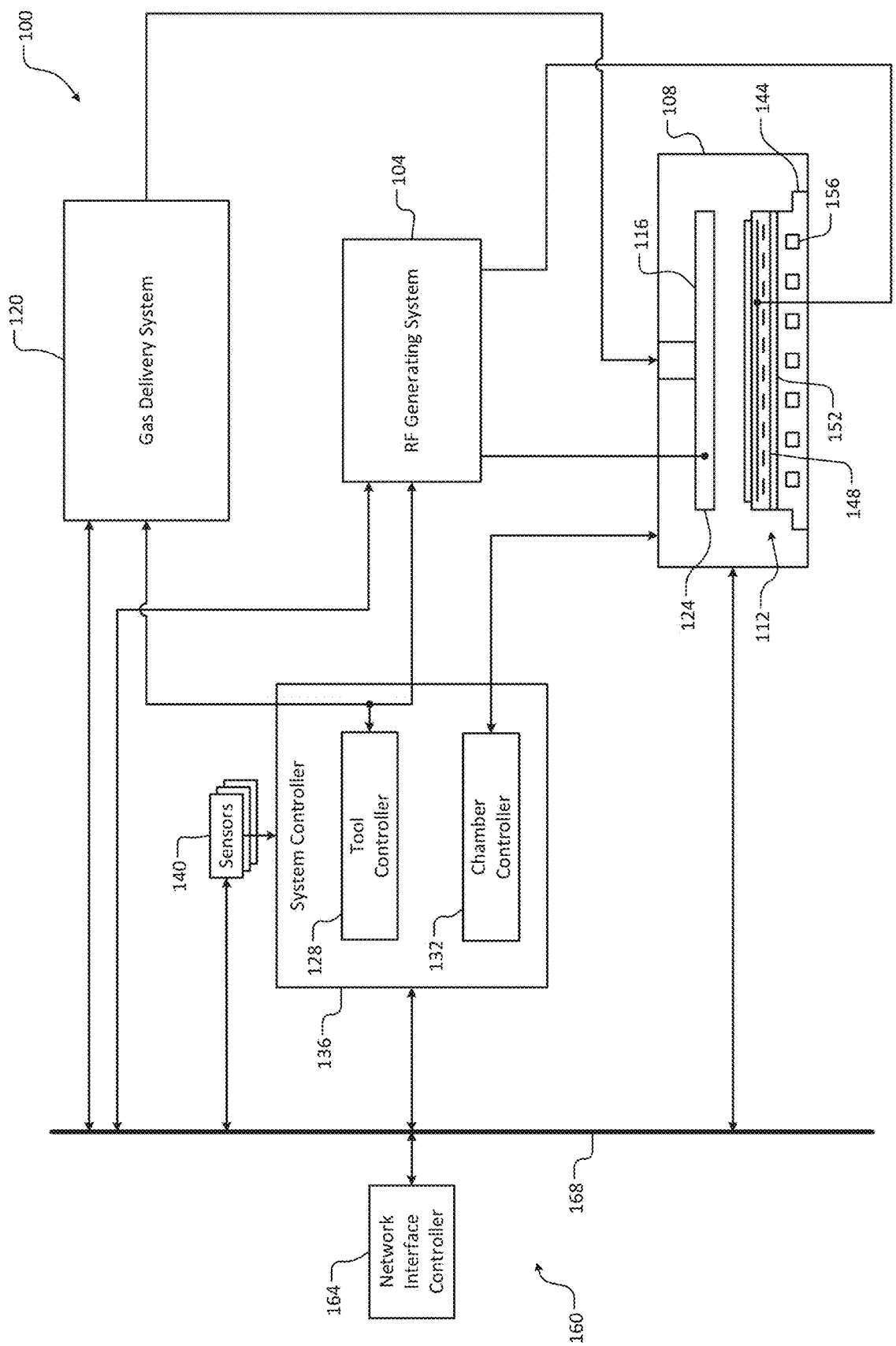
FIG. 1 is a functional block diagram of an example of a substrate processing system incorporating a data capture module in accordance with the present disclosure.

A substrate processing system may include a data monitoring system implementing one or more components for monitoring data associated with operation of the substrate processing system. Example data includes, but is not limited to, data transmitted to and from a substrate processing tool and data transmitted between system controllers and a substrate processing chamber. The data may include control data transmitted to the tool, sensor data, etc. Example components include a host computing device (e.g., a personal computer, or PC), embedded systems input/output (I/O) controllers, and commercial off-the-shelf (COTS) I/O devices. The various components may communicate using network layer protocols such as Ethernet protocol, internet protocol (IP), EtherCAT, etc. The system may include a data logging device such as a data sniffer or data logging software applications implemented on a host computer.

In some examples, the data monitoring system implements an EtherCAT protocol. Data frames in the EtherCAT protocol may contain up to 1500 bytes of data. Data communicated from components of the substrate processing system (e.g., sensors, actuators, etc.) to a data logging device (e.g., a controller, host computing device, etc.) via a communication bus may include 2, 3, or more data frames. In other words, 2 or 3 output frames may be generated per update interval (e.g., 1 millisecond (ms)), and each output frame has an associated input frame. For example, an output frame corresponds to a frame output from a master device, such as a system controller, configured to generate and output frames to the components of the substrate processing system and an input frame corresponds to the corresponding frame received from a slave device (e.g., as modified by respective components of the substrate processing system). Accordingly, for a 24 hour day, the data logging device may store approximately 777 GB of monitored data (e.g., 3 output frames per interval×1500 bytes per frame×2 (one input frame and one output frame)×1000 ms×60 seconds×60 minutes×24 hours).

Because of the large amount of data generated by the substrate processing system, it may be difficult to locate specific data. For example, to locate data indicative of an event that may only occur once per day (e.g., an intermittent fault), 777 GB of stored data is searched and analyzed. In some examples, a protocol analyzer device may be used to search the stored data. The protocol analyzer device may display a log of all data frames communicated to the data logging device, which may include millions of data frames. Typically, data within the data frames is displayed contiguously with no separation of data corresponding to different components. Accordingly, a user may be required to visually identify which data in each of the data frames corresponds to a desired component of the substrate processing system and compare the data to data for the same component in other data frames.

Data monitoring systems and methods according to the principles of the present disclosure are configured to identify, extract, and display data corresponding to desired components of the substrate processing system from stored data frames. The stored data frames may have an associated network configuration file. For example, data frames stored in an EtherCAT communication log may have an associated EtherCAT network information (ENI) file. The ENI file stores information such as Ethernet ports (e.g., assigned to each component in a system), configuration information, network topology, command information, etc. in an XML format. For example, the ENI file may be generated when the EtherCAT network is initially configured for a substrate processing system. A controller according to the present disclosure is configured in accordance with the ENI file to locate, in the stored data frames, the data associated with respective components in the substrate processing system. In some examples, the data for the respective components may be filtered and displayed visually (e.g., as an oscilloscope signal, using a graphical user interface, etc.) as described below in more detail.

Referring now to FIG. 1, an example of a substrate processing system 100 is shown. The substrate processing system 100 includes an RF generating system 104 configured to generate plasma within a processing chamber 108. The processing chamber 108 comprises a substrate support 112 that supports a substrate 116. The substrate support 112 may include an electrostatic chuck, a mechanical chuck or other type of chuck. The plasma is generated to deposit film or to etch the substrate 116. A gas delivery system 120 may be used to supply a gas mixture (e.g., process gases, purge gases, etc.) to the processing chamber 108 via an upper electrode (e.g., a showerhead) 124).

One or more controllers (e.g., a tool controller 128, a chamber controller 132, etc.) may be used to control various processes, including, but not limited to, deposition, etching, heating and/or cooling of the substrate support 112, etc. In some examples, a single controller (e.g., a system controller 136) implements functions of both the tool controller 128 and the chamber controller 132). The controllers 128/132 monitor process parameters such as temperature, pressure, etc. and control delivery of the gas mixture, striking, maintaining and extinguishing the plasma, removal of reactants, supply of cooling gas, etc.

The controllers 128/132 may receive input signals (e.g., sensor data, control data, etc.) from components of the substrate processing system 100 and, based on the input signals, control operation of the RF generating system 104, the gas delivery system 120, the processing chamber 108, and/or other components of the substrate processing system 100. For example, one or more sensors 140 located throughout the RF generating system 104, the gas delivery system 120, the processing chamber 108, and/or other components of the substrate processing system 100 provide the sensor data. The sensors 140 detect, for example, supplied RF voltages, temperatures, gas and/or coolant flow rates, and gas and/or coolant pressures.

The upper electrode 124 introduces and distributes gases into the processing chamber 108. The substrate support 112 includes a conductive baseplate 144 that acts as a lower electrode. The baseplate 144 may support a heating plate 148, which may be formed at least partially of a ceramic material. A thermal resistance layer 152 may be arranged between the heating plate 148 and the baseplate 144. The baseplate 144 may include one or more coolant channels 156 for flowing coolant through the baseplate 144. The RF generating system 104 generates a bias RF voltage to bias one of the lower electrode (e.g., the baseplate 144 of the substrate support 112) and the upper electrode 124 during operation. The other one of the upper electrode 124 and the baseplate 144 may be DC grounded, AC grounded, or at a floating potential.

The substrate processing system 100 may include a data monitoring system 160 configured to monitor and store data associated with operation of the substrate processing system 100. Example data includes, but is not limited to, data transmitted to and from the tool controller 128 and the chamber controller 132 and data transmitted between the tool controller 128, the chamber controller 132, and various components including, but not limited to, the RF generating system 104, the processing chamber 108, the gas delivery system 120, the sensors 140, etc.

The data monitoring system 160 includes a network interface controller (e.g., a host computing device) 164 and a communication bus 168. For example, the data monitoring system 160 implements an EtherCAT protocol to facilitate communication between the components of the substrate processing system 100. The network interface controller 164 is configured as a data logging device to monitor and store data communicated by components of the substrate processing system 100 within the data monitoring system 160. The network interface controller 164 according to the principles of the present disclosure is further configured to locate and analyze the stored data as described below in more detail.

Figure 2:
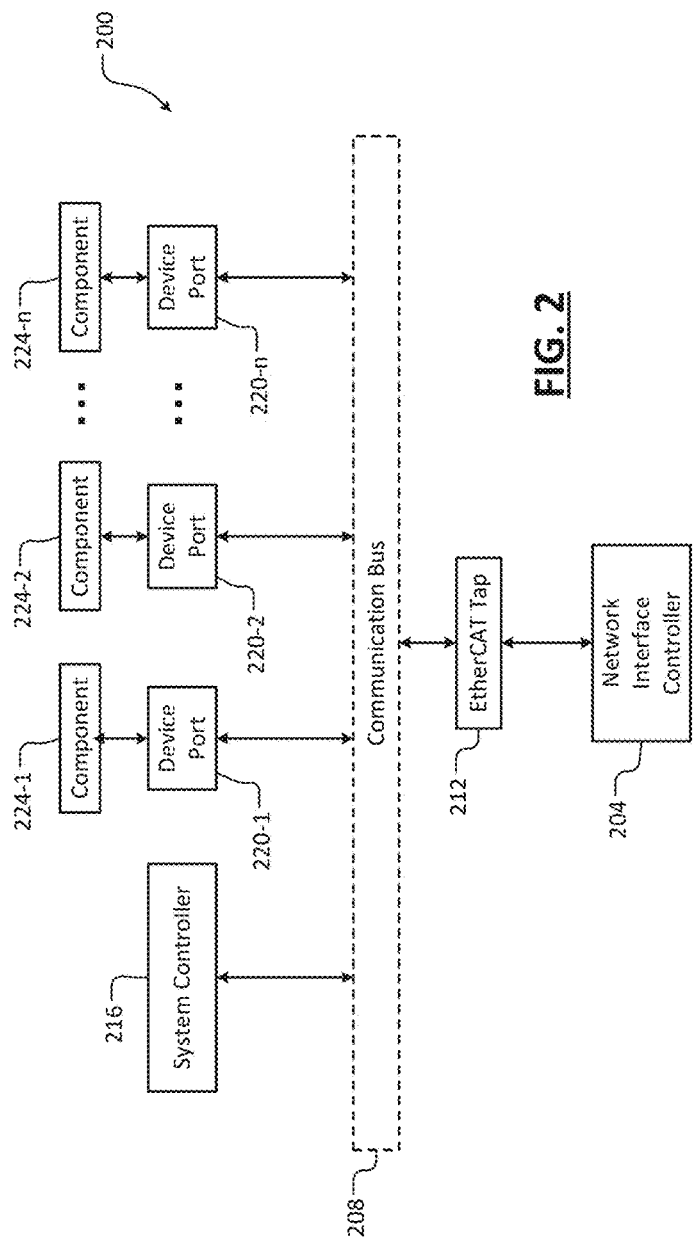
FIG. 2 is a functional block diagram of an example data monitoring system in accordance with the present disclosure.

Referring now to FIG. 2, an example data monitoring system 200 including relevant components of the substrate processing system 100 of FIG. 1 is shown. The data monitoring system 200 includes a network interface controller 204 configured to communicate with various components of a substrate processing system (e.g., the substrate processing system 100) via a communication bus 208. For example, the network interface controller 204 is configured to monitor data transmitted on the communication bus 204 via a port such as an EtherCAT tap 212. In some examples, an Ethernet switch (not shown) may be used to provide the functionality of the EtherCAT tap 212.

The data monitoring system 200 includes one or more devices configured as a master device, such as a system controller 216. The system controller 216 corresponds to, for example, the system controller 136 of FIG. 1 and may include the tool controller 128, the chamber controller 132, etc. The data monitoring system 200 further includes device ports 220-1, 220-2, . . . , and 220-n, referred to collectively as device ports 220, each corresponding to a respective slave device. For example, the slave devices correspond to components of the substrate processing system 100 such as various sensors 140 components of the gas delivery system 120, components of the RF generating system 104, components of the substrate processing chamber 108, etc. For simplicity, the various components of the substrate processing system 100 are represented as components 224-1, 224-1, . . . 224-n, referred to collectively as components 224.

The network interface controller 204 is configured to monitor and store data transmitted between the system controller 216 and the device ports 220. The data may include control data, sensor data, etc. that is generated and/or updated by the system controller 216 and the device ports 220. For example, the data monitoring system 200 implements the EtherCAT protocol and the data corresponds to EtherCAT data frames. As the master device, the system controller 216 generates data frames to be transmitted to and between each of the components 224 via the device ports 220-2. For example, the system controller 216 generates one or more (e.g., 2 or 3) data frames at each update interval. In one example, the update interval is 1 ms. The data frames output by the system controller 216 correspond to output frames. The output frames generated by the system controller 216 at each update interval are received by each of the device ports 220.

The output frames are sequentially received, updated, and output by each of the device ports 220. For example, a first device port (e.g., the device port 220-1) receives the output frames from the system controller 216, updates the output frames, and transmits the updated output frames to a next device port (e.g., the device port 220-2). The device port 220-1 updates (i.e., modifies) the output frames to include information associated with the corresponding component 224-1, such as sensor measurements, status information, and/or other information associated with operation of the substrate processing system 100. Each of the device ports 220 continues to receive, update, and transmit the output frames to a next one of the device ports 220. A last one of the device ports (e.g., the device port 220-n) transmits the output frames as updated by each of the device ports 220 back to the system controller 216. The updated frames returned to the system controller 216 at each update interval correspond to input frames.

The network interface controller 228 receives and stores the output frames as output by the system controller 216 and the input frames as received by the system controller 216 via the EtherCAT tap 212. The network interface controller 204 according to the principles of the present disclosure is further configured to locate and analyze data of specific devices within the stored data frames as described below in more detail.

Figure 3:
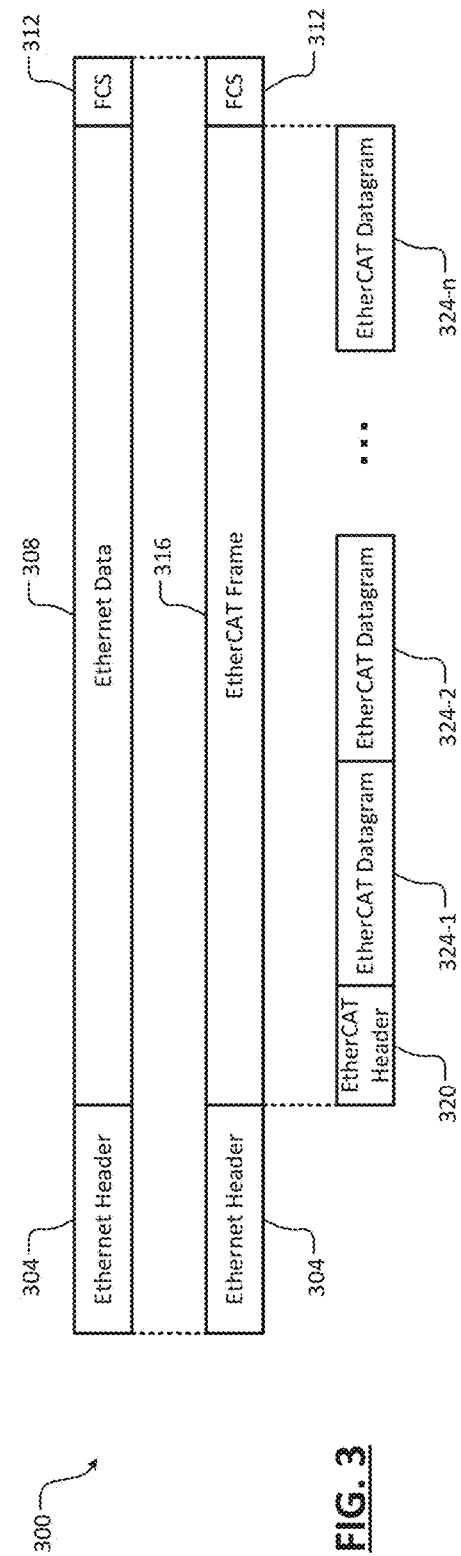
FIG. 3 is an example data frame implemented by the data monitoring system in accordance with the present disclosure.

Referring now to FIG. 3 and with continued reference to FIG. 2, an example data frame 300 according to the EtherCAT protocol implemented by the data monitoring system 200 is shown. An example Ethernet frame includes an Ethernet header 304, an Ethernet data portion 308, and one or more additional fields following the Ethernet data portion 308, such as a frame check sequence (FCS) 312. In the data frame 300, an EtherCAT frame 316 replaces the Ethernet data portion 308. In other words, the EtherCAT frame 316 is embedded within the Ethernet data portion 308.

The EtherCAT frame 316 includes an EtherCAT header 320 and a plurality of sub-frames (e.g., EtherCAT datagrams 324-1, 324-2, . . . , and 324-n, referred to collectively as EtherCAT datagrams 324). Each of the EtherCAT datagrams 324 includes data corresponding to a respective one of the components 224. For example, when one of the components 224 updates the data frame 300 in an update interval, a corresponding one of the EtherCAT datagrams 324 is modified. Each of the EtherCAT datagrams 324 may include a different address or other identifier (e.g., a 32-bit address field) corresponding to the respective one of the components 224.

The output frames and input frames stored by the network interface controller 228 correspond to the data frame 300 including the EtherCAT frame 316. Typically, the plurality of data frames 300, which may amount to hundreds of millions of the data frames 300 per day, are stored as raw (i.e., unfiltered and unsorted) data. The network interface controller 228 is configured to analyze the stored data frames 300 in accordance with a network configuration file (e.g., an ENI file) and extract specific data from the stored data frames 300. For example, the network interface controller 228 may extract (e.g., in real-time as the data is monitored on the communication bus 168, from data stored in memory, etc.) the data corresponding to a specific component as requested by a user and display the requested data in various formats. For example, the network interface controller 228 may display the requested data as raw data values (e.g., sensor measurement values in suitable units), convert the data for display as an oscilloscope signal, etc.

Figure 4:
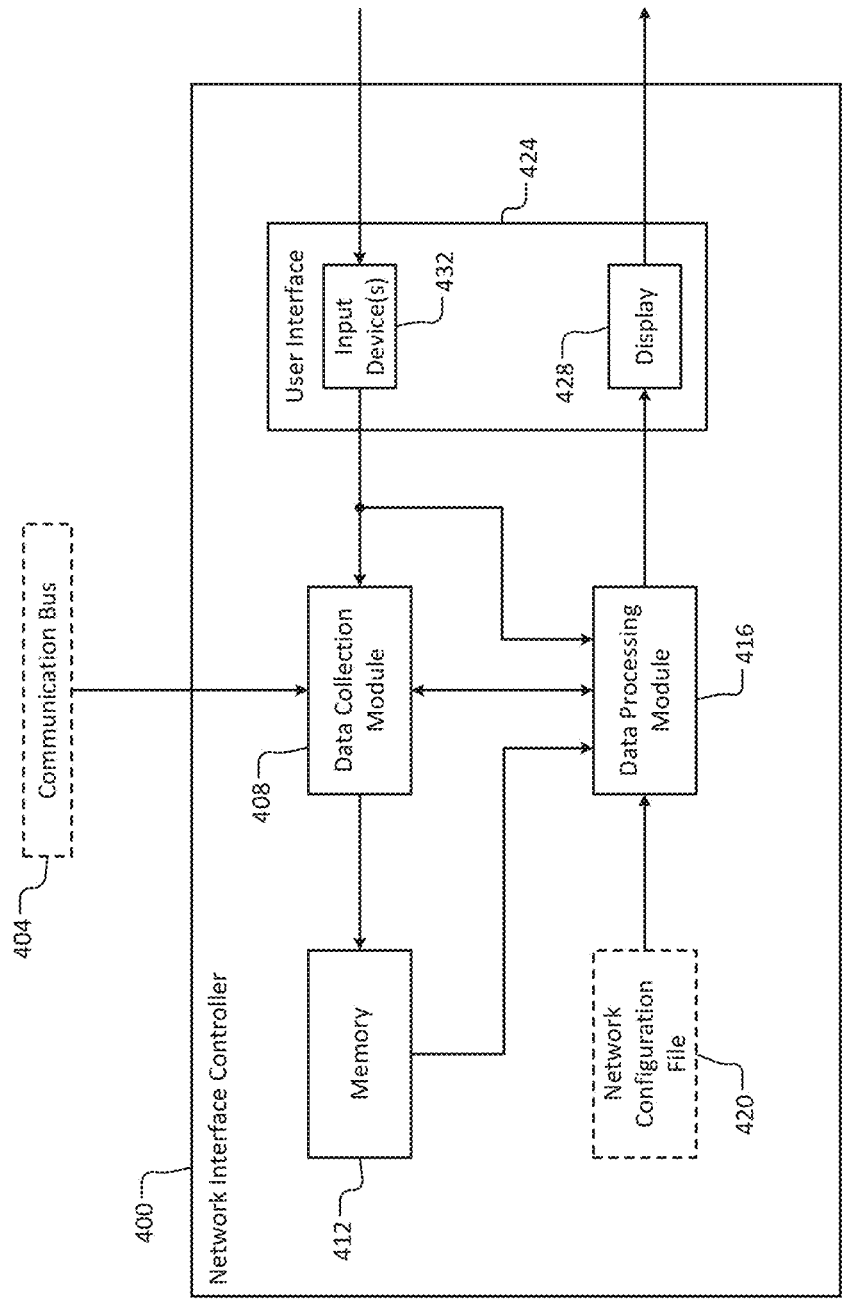
FIG. 4 is a functional block diagram of an example network interface controller in accordance with the present disclosure.

Referring now to FIG. 4, an example network interface controller 400 is configured to monitor and receive, via communication bus 404, output frames and input frames communicated between the system controller 216 and the components 224 within the data monitoring system 200. The network interface controller 400 includes a data collection module 408 configured to monitor the communication bus 404 (e.g., via the EtherCAT tap 204 as shown in FIG. 2) and collect all data frames transmitted within each update interval, including both output frames and input frames. The collected data frames are stored in memory 412. For example, the memory 412 corresponds to large capacity non-volatile semiconductor memory, such as a solid state drive (SSD). In other examples, the network interface controller 400 may include magnetic storage instead of or in addition to the memory 412, and/or may store the data in an external memory or storage location.

The data collection module 408 may also provide the data or selected portions of the data to a data processing module 416. Accordingly, the data processing module 416 is configured to extract and/or receive selected data in real-time (i.e., as the data is transmitted on the communication bus 404 and collected by the data collection module 408). The data processing module 416 may also retrieve selected stored data from the memory 412.

The data processing module 416 extracts selected data from the monitored data and/or the stored data in accordance with a network configuration file 420. For example, the network configuration file 420 may be stored in the memory 412 or other non-volatile memory. For example only, the network configuration file 420 corresponds to an EtherCAT network information (ENI) file that stores information including, but not limited to, Ethernet ports (e.g., Ethernet port identifiers assigned to the system controller 216, each of the components 224, etc.), configuration information, network topology, command information, etc. in an XML format. The network configuration file 420 may be generated when a communication network (e.g., an EtherCAT network) associated with the data monitoring system 200 is configured for the substrate processing system 100.

The information stored within the network configuration file 420 includes information indicating locations of data associated with each of the components 224 within the data frames 300. For example, each of the device ports 220 may have an associated address and each of the EtherCAT datagrams 324 may include an address of a respective one of the device ports 220. Accordingly, the data processing module 416 is configured to locate, in the data frames received via the data collection module 408 and/or stored in the memory 412, data corresponding to a desired one of the components 224 using the information stored in the network configuration file.

The data processing module 416 stores information (e.g., a map, lookup table, etc.) correlating locations of data within the data frames 300 to respective components 224, types of data, etc. For example, the data processing module 416 may store a map that correlates addresses with respective components 224, correlates locations (e.g., bit locations) within a data frame 300 or a set of the data frames 300 to data corresponding to a specific EtherCAT datagram 324, correlates bit locations within the EtherCAT datagrams 324 to specific types of data (e.g., sensor data), etc. Within the data processing module 416, the components 224 may be identified generally (e.g., Device 1, Device 2, etc.) or specifically (e.g., Temperature Sensor 1, 2, 3, Pressure Sensor 1, 2, 3, etc.). Types of data may correspond to data such as commands, digital representations of analog measurements (e.g., temperature values, electrical characteristics, valve positions, pressure values, etc.), timestampes, and/or other types of data generated by the component 224 associated with a respective one of the EtherCAT datagrams 324.

As one example, a component 224-1 may correspond to a temperature sensor and a corresponding EtherCAT datagram 324 generated by the component 224-1 includes a digital representation of a voltage generated by the temperature sensor. In other words, the component 224-1 senses a temperature and generates a voltage indicative of the sensed temperature, and converts the voltage to a digital value that is contained within the corresponding EtherCAT datagram 324. Although each of the EtherCAT datagrams 324 may include multiple samples and/or types (and thousands of bytes) of data, for simplicity only a single sampled value of the component 224-1 is described. For example only, the sampled value may correspond to a single sensed temperature in an update interval.

The data processing module 416 uses the map as constructed using the network configuration file 420 to extract the sampled value of the component 224-1 from the data frame 300. For example, the map may indicate that bits x through y of the data frame 300 correspond to the sampled value of the component 224-1. In another example, the map may indicate that a specific EtherCAT datagram 324 of the data frame 300 corresponds to the component 224-1 (e.g., an EtherCAT datagram 324 having an address correlated to the component 224-1) and bits x through y of the EtherCAT datagram 324 correspond to the sampled value of the component 224-1. The data processing module 416 extracts the bits corresponding to the sampled value and outputs data representing the extracted bits to a user interface 424. The data output by the data processing module 416 may include other data within the EtherCAT datagram 324, such as an identifier of the component 224-1, a timestamp associated with the sampled value, etc.

For example, the data output by the data processing module 416 is provided to a display 428 of the user interface 424. The data output by the data processing module 416 may be filtered in accordance with inputs provided by a user via an input device 432 of the user interface 432. For example, the user may select whether to extract data from the data frames 300 previously stored within the memory 412 (and a time period of the data to extract) and/or data from the data frames 300 being monitored in real-time via the data collection module 408, data corresponding to one or more of the components 224 to be extracted, one or more types of data to be extracted (e.g., temperature data from one or more temperature sensors, temperate and pressure data, etc.), a display format of the data, etc.

Figure 5A:
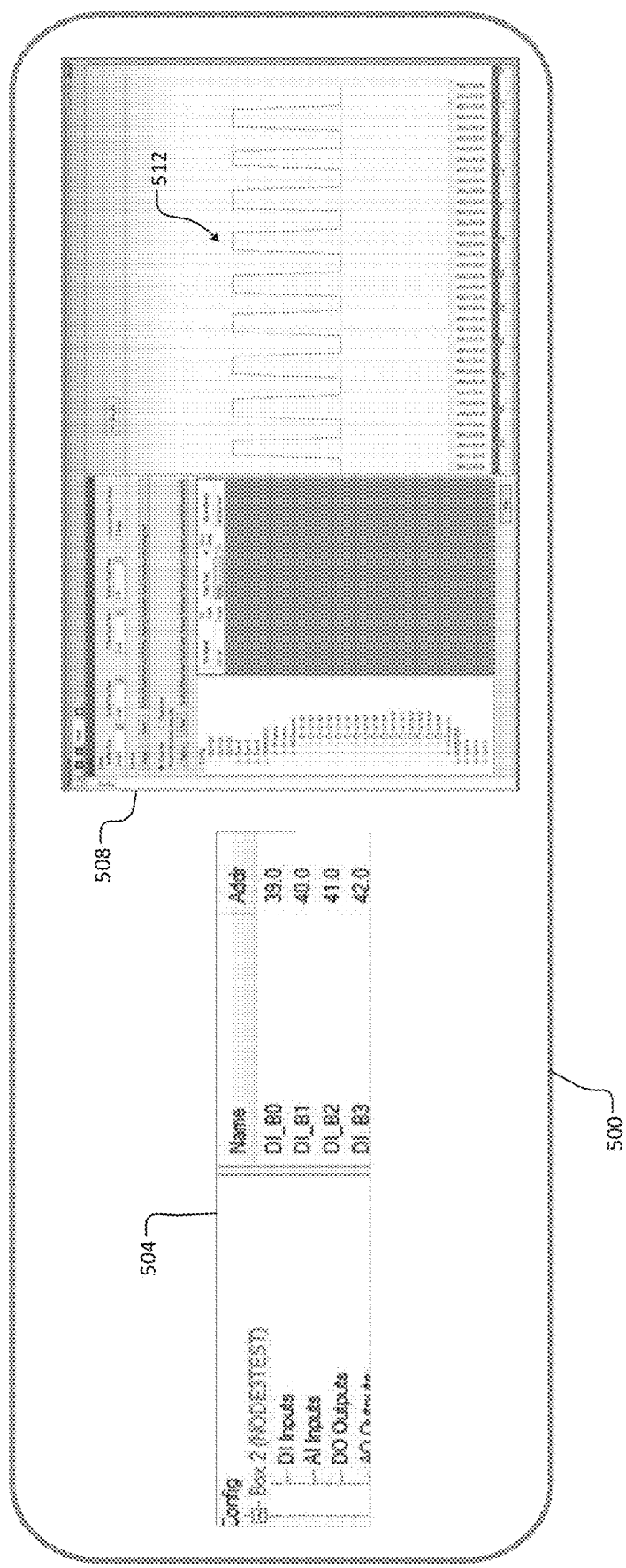
Figure 5B:
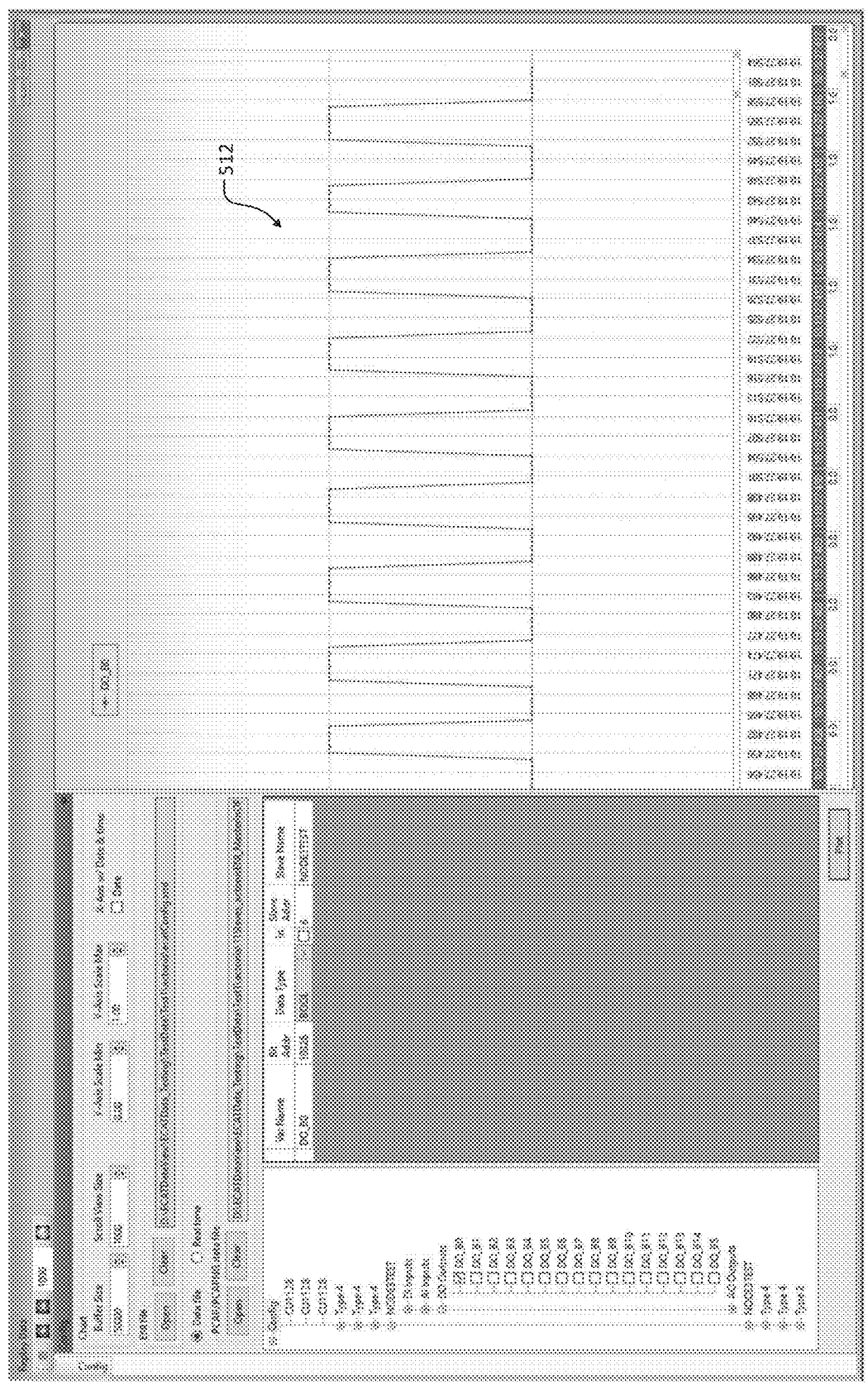
Figure 5C:
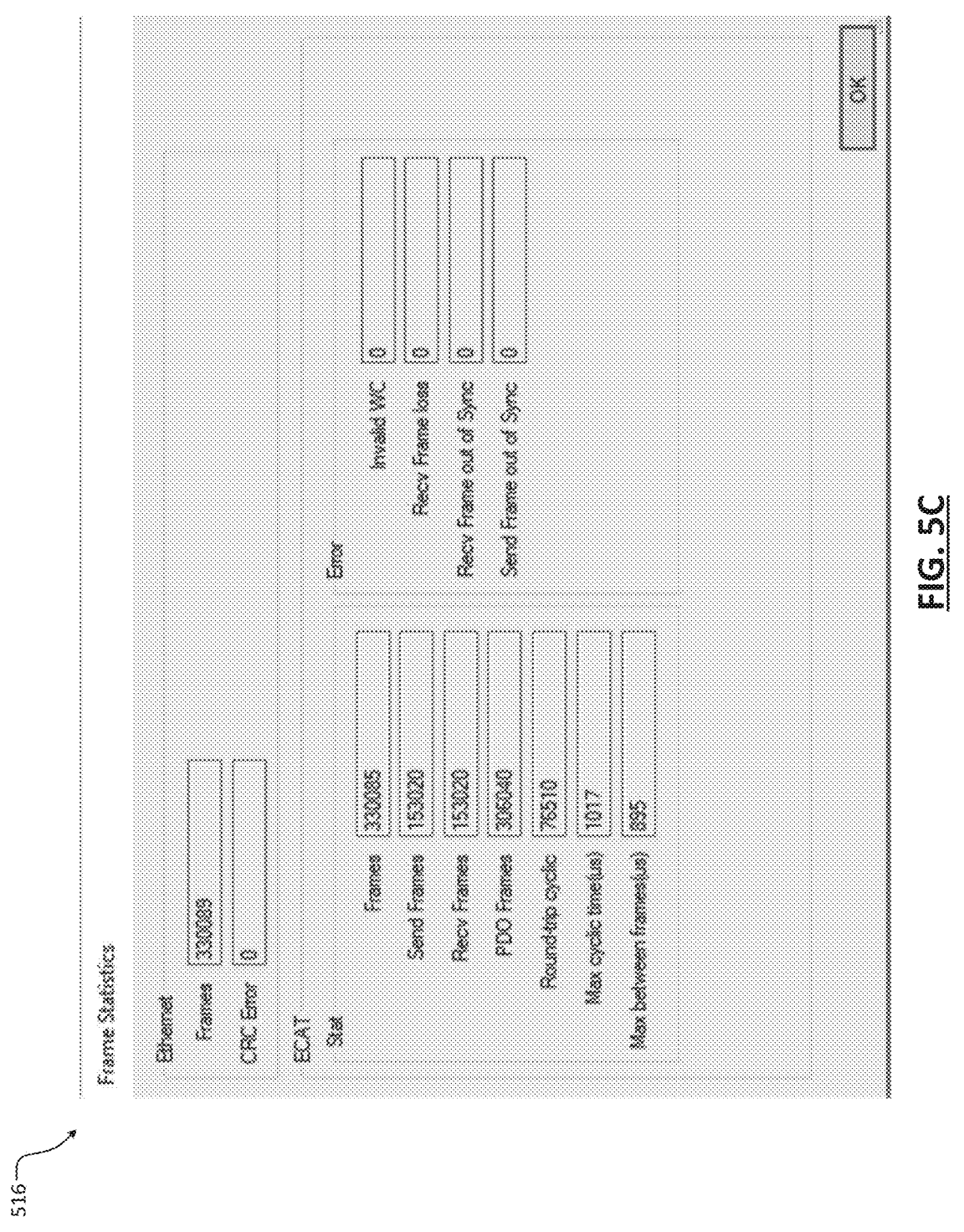

Referring now to FIGS. 5A, 5B, and 5C and with continued reference to FIG. 4, and example user interface 500 (e.g., corresponding to the user interface 424) includes an input interface 504 and an output (i.e., display) interface 508. For example, the input interface 504 may correspond to a touchscreen, input parameters selectable and changeable using a mouse, keyboard, and/or other input device, etc. As shown, the input interface 504 may be configured to allow the user to select a desired one or more of the components 224 based on a type of data, a name of the component 224, an address of the component 224, etc. Other input parameters include, but are not limited to, a time period of data to be extracted from the memory 412, whether to extract stored or real-time data, a display format of the data, etc.

Data corresponding to the selected one or more components 224 is displayed via the output interface 508 in accordance with the input parameters selected by the user. The data may include an oscilloscope signal 512 displayed in real-time, and may include a timestamp, a source of the data (e.g., which of the components 224 generated the data), a destination of the data, the bit and/or byte, content of the data, etc. For example, the data output by the data processing module 416 may be converted from raw bit data to the oscilloscope signal 512. For example only, the oscilloscope signal 512 may correspond to a digital representation of a voltage signal generated by a sensor, a sensed value (e.g., a temperature) corresponding to the voltage signal, etc.

In some examples, jitter and latency of the data monitoring system may be measured (e.g., with accuracy to the nanosecond) and displayed via the output interface 508. Other network performance and/or frame statistics (e.g., bus load, frame errors, frame losses, etc.) 516 may also be tracked, stored, and displayed using the network interface controller 400 as shown in FIG. 5C.

Figure 6:
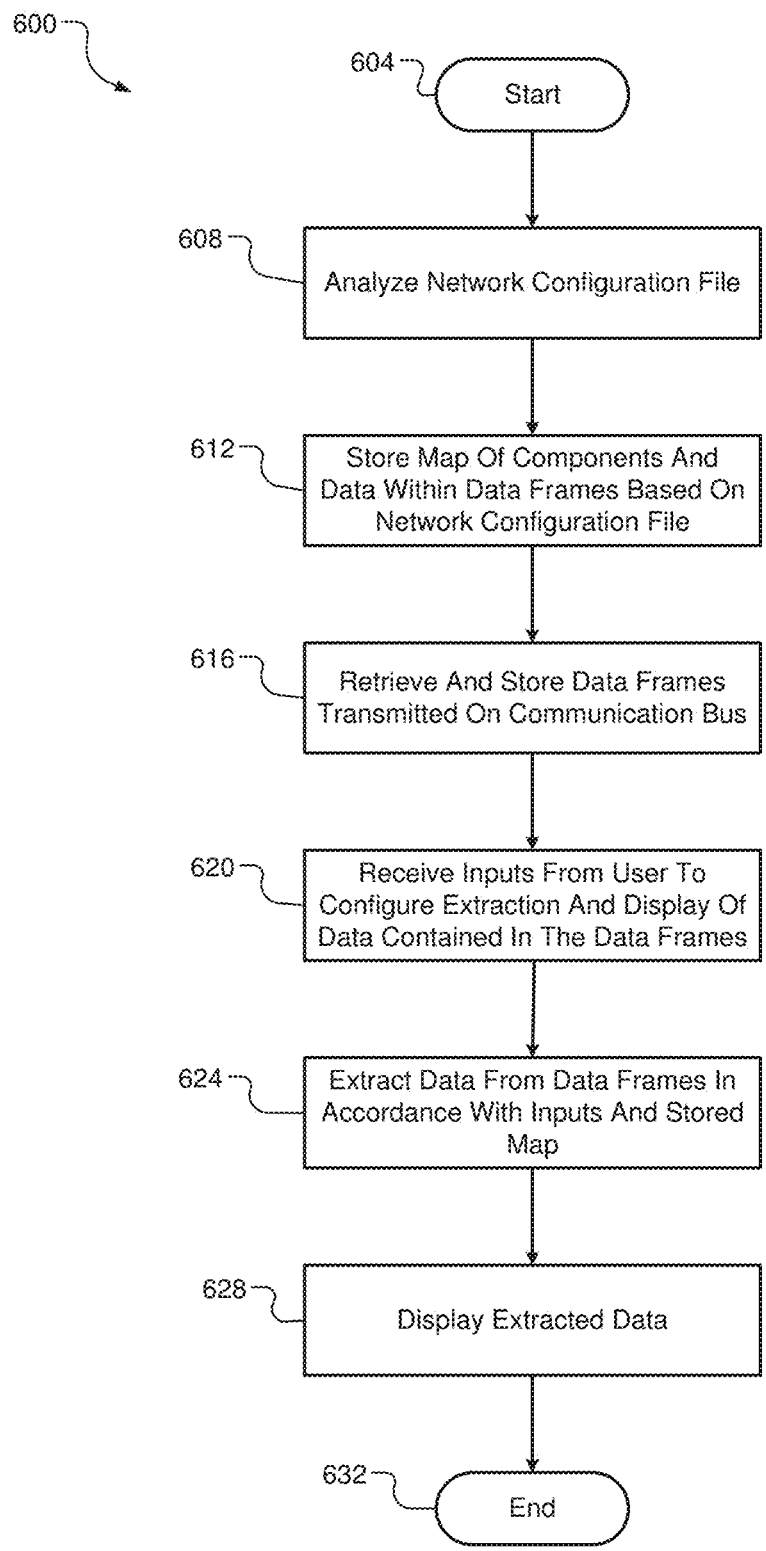
FIG. 6 illustrates steps of an example method for monitoring, extracting, and displaying data transmitted within a data monitoring system in accordance with the present disclosure.

Referring now to FIG. 6, an example method 600 for monitoring, extracting, and displaying data transmitted within a data monitoring system in accordance with the present disclosure begins at 604. At 608, a network configuration file (e.g., an EtherCAT ENI file) is analyzed. For example, contents of the network configuration file are analyzed to determine respective addresses assigned to components in a substrate processing system, locations (e.g., bit locations) of data corresponding to respective components within one or more data frames, locations of specific data within each datagram or data frame, etc. At 612, the method 600 (e.g., the data processing module 416) generates and stores information (e.g., a map, lookup table, etc.) correlating locations of data within the data frames to respective components, types of data, etc. based on the analyzed contents of the network configuration file as described above in FIG. 4.

At 616, the method 600 (e.g., the data collection module 408) retrieves and stores communications between components of the substrate processing system. For example, the data collection module 408 monitors the communication bus 404 to extract and stores data frames communicated on the communication bus 404 in the memory 412. At 620, the method 600 (e.g., the user interface 424) receives inputs from a user to configure extraction of data from the data frames. At 624, the method 600 (e.g., the data processing module 416) extracts data from the stored data frames and/or in real-time from the data frames provided by the data collection module 408 in accordance with the inputs received from the user and the stored information (i.e., the stored map). At 628, the method 600 (e.g., the data processing module 416 and the user interface 424) displays the extracted data in one or more formats (e.g., numerical values, an oscilloscope signal, etc.) in accordance with the inputs received from the user. The method 600 ends at 632.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In the figures, the direction of an arrow, as indicated by the arrowhead, generally demonstrates the flow of information (such as data or instructions) that is of interest to the illustration. For example, when element A and element B exchange a variety of information but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

In this application, including the definitions below, the term "module" or the term "controller" may be replaced with the term "circuit." The term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

The term code, as used above, may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. The functional blocks, flowchart components, and other elements described above serve as software specifications, which can be translated into the computer programs by the routine work of a skilled technician or programmer.

The computer programs include processor-executable instructions that are stored on at least one non-transitory, tangible computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language), XML (extensible markup language), or JSON (JavaScript Object Notation) (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective-C, Swift, Haskell, Go, SQL, R, Lisp, Java®, Fortran, Perl, Pascal, Curl, OCaml, Javascript®, HTML5 (Hypertext Markup Language 5th revision), Ada, ASP (Active Server Pages), PHP (PHP: Hypertext Preprocessor), Scala, Eiffel, Smalltalk, Erlang, Ruby, Flash®, Visual Basic®, Lua, MATLAB, SIMULINK, and Python®.

What is claimed is:

1. A network interface controller for a communication network of a substrate processing system, the network interface controller comprising:

a data collection module coupled to a communication bus of the substrate processing system, wherein the data collection module is configured to monitor the communication bus to retrieve and store data frames transmitted between components of the substrate processing system on the communication bus;

a user interface configured to receive inputs for configuring extraction of data from the data frames; and a data processing module configured to store, based on a network configuration file, a map correlating relative locations of data within the data frames to at least one of respective ones of the components of the substrate processing system and types of data, wherein the network configuration file stores configuration information for the communication network, extract data from the data frames in accordance with the inputs received by the user interface and the map, and provide, to the user interface, the data as extracted from the data frames, wherein the user interface is further configured to display the data as extracted from the data frames in accordance with the inputs received by the user interface.

2. The network interface controller of claim 1, wherein the communication network is an EtherCAT network.

3. The network interface controller of claim 1, wherein the network configuration file is an EtherCAT network information (ENI) file.

4. The network interface controller of claim 1, wherein the network configuration file stores the configuration information in an XML format.

5. The network interface controller of claim 1, wherein the relative locations of the data within the data frame correspond to bit locations within the data frame.

6. The network interface controller of claim 1, wherein the map correlates sub-frames of the data frames with respective ones of the components of the substrate processing system.

7. The network interface controller of claim 1, wherein the data extracted from the data frames includes sensor data.

8. The network interface controller of claim 1, wherein the user interface includes a display configured to display the data extracted from the data frames.

9. The network interface controller of claim 1, wherein the user interface is configured to display the data extracted from the data frames as an oscilloscope signal.

10. A method of operating a communication network of a substrate processing system, the method comprising:

using a data collection module coupled to a communication bus of the substrate processing system, monitoring the communication bus to retrieve and store data frames transmitted between components of the substrate processing system on the communication bus;

receiving, via a user interface, inputs for configuring extraction of data from the data frames; and using a data processing module, storing, based on a network configuration file, a map correlating relative locations of data within the data frames to at least one of respective ones of the components of the substrate processing system and types of data, wherein the network configuration file stores configuration information for the communication network, extracting data from the data frames in accordance with the inputs received by the user interface and the map, and providing, to the user interface, the data as extracted from the data frames, the data as extracted from the data frames is displayed in accordance with the inputs received by the user interface.

11. The method of claim 10, wherein the communication network is an EtherCAT network.

12. The method of claim 10, wherein the network configuration file is an EtherCAT network information (ENI) file.

13. The method of claim 10, further comprising storing the configuration information in the network configuration file in an XML format.

14. The method of claim 10, wherein the relative locations of the data within the data frame correspond to bit locations within the data frame.

15. The method of claim 10, wherein the map correlates sub-frames of the data frames with respective ones of the components of the substrate processing system.

16. The method of claim 10, wherein the data extracted from the data frames includes sensor data.

17. The method of claim 10, further comprising using a display to display the data extracted from the data frames.

18. The method of claim 10, further comprising displaying the data extracted from the data frames as an oscilloscope signal.

* * * * *